(12) United States Patent
Biddle

(10) Patent No.: US 11,056,838 B2
(45) Date of Patent: Jul. 6, 2021

(54) TRANSCEIVER RECEPTACLE WITH EMI CAGE AND BEZEL CLIPS THAT PROVIDE HIGH SHIELDING EFFECTIVENESS

(71) Applicant: Samtec, Inc., New Albany, IN (US)

(72) Inventor: Gary E. Biddle, New Albany, IN (US)

(73) Assignee: SAMTEC, INC., New Albany, IN (US)

( * ) Notice: Subject to any disclaimer, the term of this patent is extended or adjusted under 35 U.S.C. 154(b) by 0 days.

(21) Appl. No.: 16/629,308

(22) PCT Filed: Aug. 22, 2018

(86) PCT No.: PCT/US2018/047504
§ 371 (c)(1),
(2) Date: Jan. 7, 2020

(87) PCT Pub. No.: WO2019/040610
PCT Pub. Date: Feb. 28, 2019

(65) Prior Publication Data
US 2020/0127422 A1    Apr. 23, 2020

Related U.S. Application Data

(60) Provisional application No. 62/549,267, filed on Aug. 23, 2017.

(51) Int. Cl.
*H01R 13/6583* (2011.01)
*H05K 1/18* (2006.01)

(52) U.S. Cl.
CPC ........... *H01R 13/6583* (2013.01); *H05K 1/18* (2013.01); *H05K 2201/10189* (2013.01); *H05K 2201/10371* (2013.01)

(58) Field of Classification Search
CPC ............ H01R 13/6582; H01R 13/6583; Y10S 439/927; Y10S 439/939; G02B 6/4277; H05K 9/0058
See application file for complete search history.

(56) References Cited

U.S. PATENT DOCUMENTS 6,368,153 B1    4/2002   Hwang
6,478,622 B1    11/2002  Hwang
(Continued)

FOREIGN PATENT DOCUMENTS

CN          2562509 Y      7/2003
CN          202797485 U    3/2013
(Continued)

OTHER PUBLICATIONS

Official Communication issued in International Patent Application No. PCT/US2018/047504, dated Dec. 4, 2018.
(Continued)

*Primary Examiner* — Tho D Ta
(74) *Attorney, Agent, or Firm* — Keating & Bennett, LLP

(57) ABSTRACT

A receptacle includes a cage, a bezel opening in the cage, and at least one bezel clip mounted adjacent to the bezel opening. The at least one bezel clip includes first bezel fingers and second bezel fingers. The first bezel fingers are located along an inner surface of the cage. The second bezel fingers include outer fingers located along an outer surface of the cage and inner fingers located along the inner surface of the cage. The inner and outer fingers of the second bezel fingers are defined by the second bezel fingers passing through a through hole in the cage.

13 Claims, 12 Drawing Sheets

(56) References Cited

U.S. PATENT DOCUMENTS

| | | | |
|---|---|---|---|
| 6,517,382 B2 | 2/2003 | Flickinger et al. | |
| 7,001,217 B2 | 2/2006 | Bright et al. | |
| 7,170,013 B2 | 1/2007 | Lewis | |
| 7,455,554 B2* | 11/2008 | Long | G02B 6/4256 |
| | | | 439/607.17 |
| 7,758,381 B2 | 7/2010 | Oki | |
| 7,869,224 B1* | 1/2011 | Yang | G02B 6/4284 |
| | | | 361/800 |
| 8,444,437 B2 | 5/2013 | Szczesny et al. | |
| 9,373,901 B2* | 6/2016 | Singer | H01R 4/4881 |
| 9,413,115 B1 | 8/2016 | Henry | |
| 2002/0094722 A1 | 7/2002 | Festag | |
| 2007/0114060 A1 | 5/2007 | Barringer et al. | |
| 2008/0233799 A1 | 9/2008 | Winker et al. | |
| 2010/0266246 A1 | 10/2010 | van Haaster | |
| 2010/0310215 A1 | 12/2010 | Yoshikawa | |
| 2013/0048367 A1* | 2/2013 | Ljubijankic | H01R 13/6583 |
| | | | 174/354 |
| 2013/0186681 A1* | 7/2013 | Wickes | H05K 9/0009 |
| | | | 174/382 |
| 2015/0171545 A1 | 6/2015 | Yu et al. | |
| 2017/0168249 A1* | 6/2017 | Maeda | G02B 6/4261 |

FOREIGN PATENT DOCUMENTS

| | | |
|---|---|---|
| CN | 103151651 A | 6/2013 |
| CN | 104716486 A | 6/2015 |
| CN | 106159571 A | 11/2016 |
| CN | 205752808 U | 11/2016 |

OTHER PUBLICATIONS

Official Communication issued in corresponding Chinese Patent Application No. 201880054427.6, dated Sep. 9, 2020.
Official Communication issued in corresponding European Patent Application No. 18847598.2, dated Apr. 1, 2021.

* cited by examiner

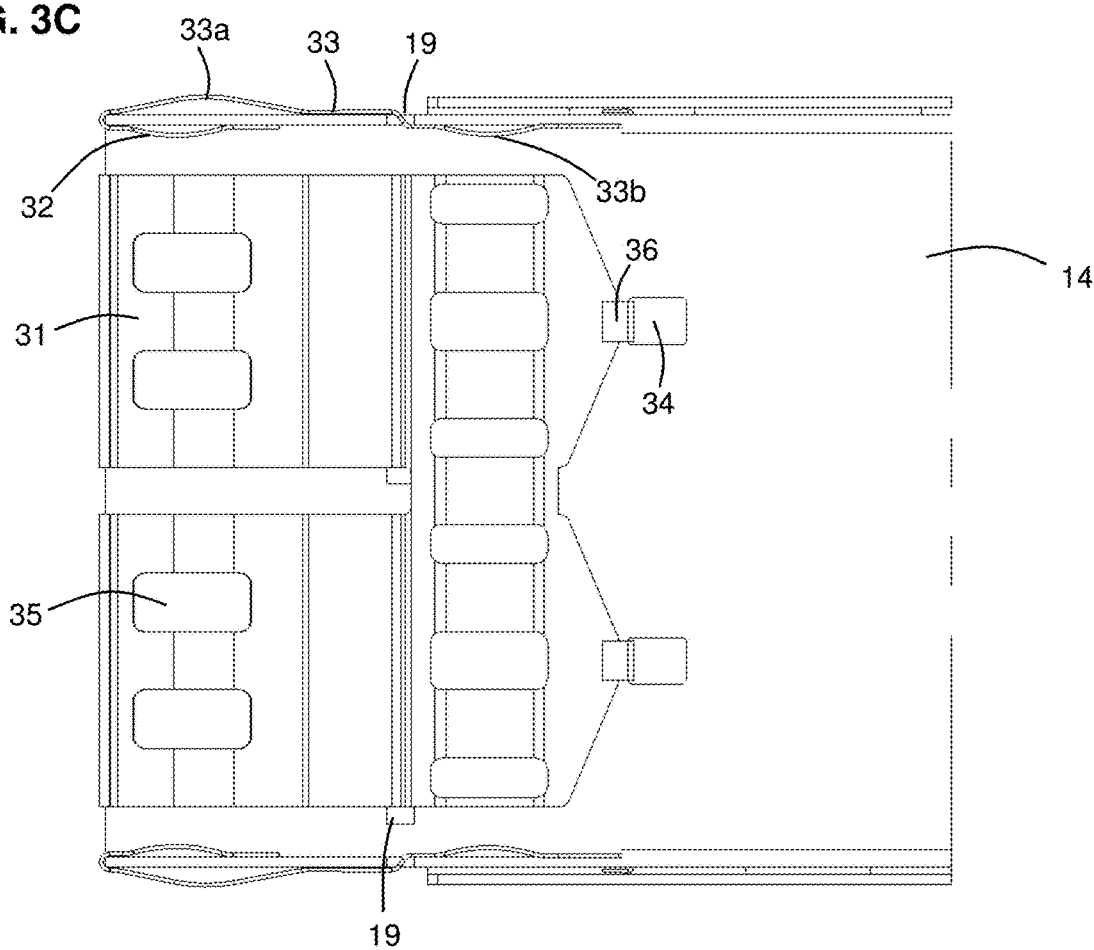
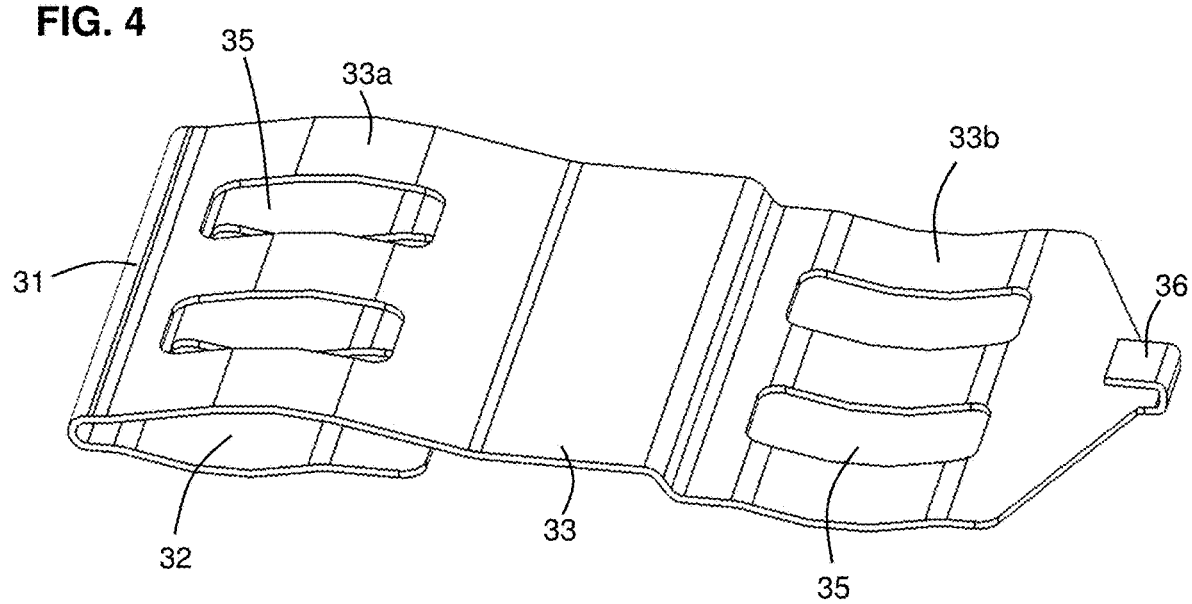

TRANSCEIVER RECEPTACLE WITH EMI CAGE AND BEZEL CLIPS THAT PROVIDE HIGH SHIELDING EFFECTIVENESS

BACKGROUND OF THE INVENTION

1. Field of the Invention

The present invention relates to transceiver assemblies. More specifically, the present invention relates to shielding of a cage of a transceiver receptacle that receives a transceiver in a transceiver assembly.

2. Description of the Related Art

Electrical connectors are used to allow electrical devices, such as substrates or printed circuit boards (PCBs), to communicate with one another. Electrical connectors are also used along the path between electrical devices to connect cables to other cables or to substrates. A connector may be thought of as having two portions, a first portion which connects to a first electrical device or a first cable and a second portion which connects to a second electrical device or a second cable, to be put into communication with the first device or first cable. To connect the two electrical devices or cables, the first and second portions of the connector are mated together.

A connector can include one set of contacts in the first portion and a second set of contacts in the second portion to be connected with the contacts of the first portion. This can be readily accomplished by providing a male connector and a female connector with corresponding sets of contacts that engage when the male and female connectors are mated. Further, the male and female connectors can be connected to and disconnected from each other to respectively electrically connect and disconnect the electrical devices to which they are connected.

Accordingly, the first and second connector portions are connected to an electrical device or cable through its contacts. The contacts are typically permanently connected to the electrical device or cable. For example, the first connector portion can be connected to a cable, and the second connector portion can be connected to a substrate. The first connector portion can be connected to the second connector portion to allow transmission of signals to and from devices on and/or in the substrate. The second connector portion is connected to devices on and/or in the substrate with electrical traces etched in the substrate.

Various standards and specifications have been proposed and implemented for electrical connectors that transmit high-frequency signals. One example is Quad Small Form-factor Pluggable (QSFP), which is a specification for compact, hot-pluggable transceivers typically used in data communication systems. QSFP transceiver receptacles can accept both electrical and optical transceivers. Recently, a modification to QSFP, referred to as Quad Small Form-factor Pluggable Double Density (QSFP-DD) has been proposed to include an additional row of contacts on a transceiver circuit board to increase bandwidth.

However, despite shielding that is commonly included in transceiver receptacles, including QSFP transceiver receptacles, electromagnetic interference (EMI) is a still a concern for devices that include electrical connectors such as those described above.

For example, in a device that includes a QSFP transceiver receptacle, a physical opening is provided in the device that reduces the overall shielding effectiveness of the device and allows both EMI from external devices to affect operation of the device and EMI from the device to affect the operation of external devices. In addition, the problems of EMI emitted from the device and EMI emitted from the device occur both when the transceiver receptacle is empty and when a transceiver is inserted into the transceiver receptacle.

FIG. 10 is a partial perspective view of the bezel clips 201 of a known transceiver receptacle 200. As shown in FIG. 10, the bezel clips 201 include inner and outer fingers 202, 203. The bezel clips 201 are attached adjacent to the bezel opening 205 of the known transceiver receptacle 200. In addition, the outer fingers 203 are only located on the exterior surfaces of the cage 204 of the known transceiver receptacle 200 and do not pass through or touch through holes in the cage 204. In addition, the inner fingers 202 are located on the interior surfaces of the cage 204 of the known transceiver receptacle 200 and extend a distance into the cage 204 that is equal to or approximately equal to a distance that the outer fingers 203 extend along the exterior surfaces of the cage 204, as shown in FIG. 10. The inner fingers 202 do not provide a ground connection that extends beyond the bezel opening 205 of the known transceiver receptacle 200. Finally, the cage 204 of the known transceiver 200 also includes large cut-outs located near the bezel opening 205. According to the above design and arrangement of the components of the known transceiver receptacle 200 shown in FIG. 10, a lower shielding effectiveness is provided.

FIG. 11 shows a transceiver 210 inserted into a known transceiver receptacle 200. The bezel clips 201 attached to the cage 204 allow for EMI generated in the transceiver 210 to be transmitted to the device's exterior (to the left in FIG. 11). As shown in FIG. 11, EMI generated within the transceiver 210 is routed by an electrical path #1 from the inner fingers 202, to the device's exterior, and to a ground connection between the raised surface of the outer fingers 203 and the chassis ground 101.

FIGS. 12A and 12B show apertures 206 in the known bezel clip 201 of a known transceiver receptacle 200. As shown in FIG. 12A, the apertures 206 are formed by spaces between the fingers 202, 203 of the bezel clip 201 of the known transceiver receptacle 200. These apertures 206 are visible, line-of-sight apertures that provide paths for EMI to escape through the bezel opening 205 of the known transceiver receptacle 200, as shown in FIG. 12B, and out of a panel opening in device 100.

FIGS. 12A and 12B show spring apertures 208 that are created when springs 207 are formed in the bottom of the cage 204 of a known transceiver receptacle 200. As shown in FIGS. 17A and 17B, the spring apertures 208 are needed to securely fit and hold a transceiver 210 in the known transceiver receptacle 200, for example, to support the weight of a heatsink. However, the spring apertures 208 formed in the bottom of the cage 204 of the known transceiver receptacle 200 provide paths for EMI to escape through the bezel opening 205 of the known transceiver receptacle 200. In addition, for example, a transceiver 210 can snag on one of the springs 207 of the known transceiver receptacle 200 if the transceiver 210 is accidentally inserted too far into the known transceiver receptacle 200, which can damage the spring 207 when the transceiver 210 is removed.

SUMMARY OF THE INVENTION

To overcome the problems described above, preferred embodiments of the present invention provide a transceiver receptacle with significantly improved EMI performance.

A receptacle according to a preferred embodiment of the present invention includes a cage, a bezel opening in the cage, and at least one bezel clip mounted adjacent to the bezel opening. The at least one bezel clip includes first bezel fingers and second bezel fingers. The first bezel fingers are located along an inner surface of the cage. The second bezel fingers include outer fingers located along an outer surface of the cage and inner fingers located along the inner surface of the cage. The inner and outer fingers of the second bezel fingers are defined by the second bezel fingers passing through a through hole in the cage.

The inner fingers of the second bezel fingers preferably extend farther into the interior of the cage than the first bezel fingers extend along the exterior of the cage. Preferably, when the receptacle is mounted in an electronic device with a shielded enclosure and when a transceiver is inserted into the receptacle, the inner fingers of the second bezel fingers provide a ground path between the transceiver and the shielded enclosure that is located completely within the electronic device. In an insertion direction of a transceiver, apertures in the first bezel fingers preferably do not overlap with apertures in the inner portions of the second bezel fingers. Preferably, no spring apertures are included on a bottom of the cage. When a transceiver is inserted into the receptacle, each of the first bezel fingers and the inner fingers of the second bezel fingers preferably contact the transceiver.

An electronic device according to a preferred embodiment of the present invention includes a shielded enclosure, a receptacle according to one of the various preferred embodiments of the present invention mounted in the electronic device, and a transceiver inserted into the receptacle. The inner fingers of the second bezel fingers provide a ground path between the transceiver and the shielded enclosure that is located completely within the electronic device.

A receptacle according to a preferred embodiment of the present invention includes a cage and a bezel clip including first inner fingers and second inner fingers. The second inner fingers are spaced away from a bezel opening of the cage, are spaced away from first inner fingers, and only physically touch an electrically conductive outer surface of a mating connector of the receptacle.

A receptacle according to a preferred embodiment of the present invention includes a transceiver cage that includes a bottom wall that is devoid of springs and of apertures associated with springs.

A bezel clip for a connector cage according to a preferred embodiment of the present invention includes outer fingers that physically contact a panel of a device that includes the connector cage, first inner fingers that physically touch an outer surface of a mating connector of the connector cage, and second inner fingers spaced from the outer fingers and the first inner fingers and only physically touching an outer surface of the mating connector.

The above and other features, elements, steps, configurations, characteristics and advantages of the present invention will become more apparent from the following detailed description of preferred embodiments of the present invention with reference to the attached drawings.

BRIEF DESCRIPTION OF THE DRAWINGS

FIGS. 3A to 3C are a partial sectional view, a partial perspective view, and a cross-sectional view of the transceiver receptacle shown in FIG. 2.

FIG. 4 is a perspective view of one of the bezel clips shown in FIGS. 3A to 3C.

DETAILED DESCRIPTION OF PREFERRED EMBODIMENTS

Preferred embodiments of the present invention will now be described in detail with reference to FIGS. 1 to 9. Note that the following description is in all aspects illustrative and not restrictive and should not be construed to restrict the applications or uses of the preferred embodiments of the present invention in any manner.

Figure 1:
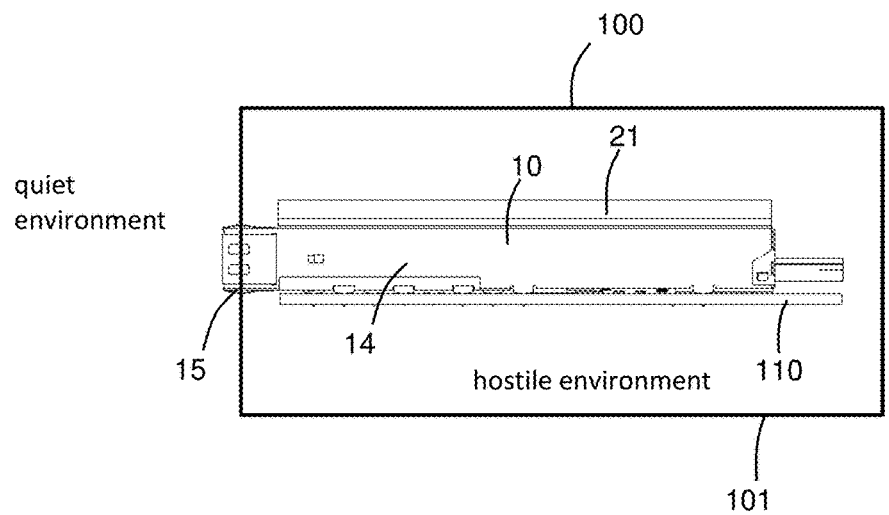
FIG. 1 is a schematic diagram showing an arrangement of a transceiver receptacle included in a device in accordance with a preferred embodiment of the present invention.

FIG. 1 is a schematic diagram showing an arrangement of a transceiver receptacle 10 included in a device in accordance with a preferred embodiment of the present invention. The transceiver receptacle 10 includes a cage 14 that provides EMI shielding for the device 100 and for external devices (not shown in FIG. 1). As shown in FIG. 1, the cage 14 is grounded to a chassis ground 101 of the device 100, and the transceiver receptacle 10 includes a bezel opening 15 that receives an electrical component, such as a transceiver 20. The bezel opening 15 provides an opening in the device 100 that is susceptible to both receiving and emitting EMI. FIG. 1 shows an example in which the transceiver receptacle 10 is not mated with a transceiver 20 and in which the device 100 internally generates EMI ("hostile environment") that is shielded from an exterior of the device ("quiet environment"). As a more specific example, if the device 100 has high internal energy levels that generate a large amount of EMI, the cage 14 preferably has high shielding effectiveness to meet standards or guidelines for electromagnetic compatibility (EMC) compliance. EMC compliance can vary, for example, according to the particular application or surrounding environment of the device 100. Shielding effectiveness of the cage 14 is determined by the amount of power of the EMI that transfers between the internal and external environments of the device 100.

Figure 2:
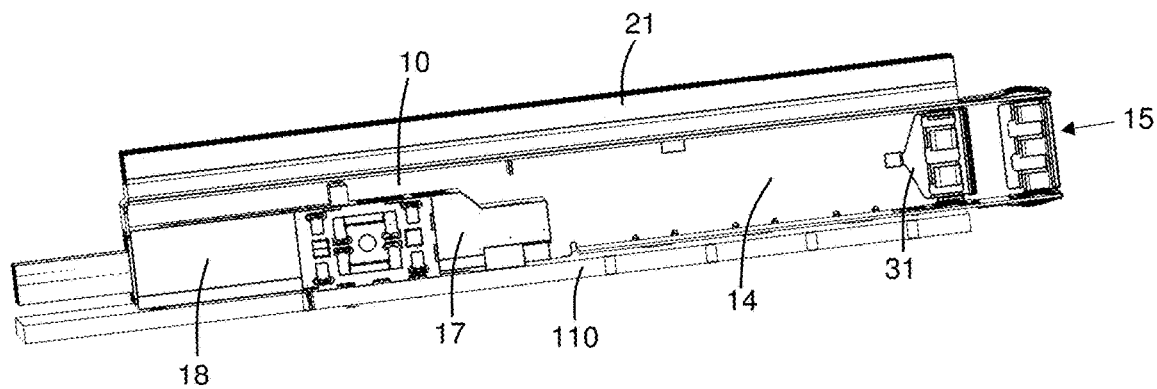
FIG. 2 is a perspective sectional view of a transceiver receptacle in accordance with a preferred embodiment of the present invention

FIG. 2 is a perspective view of a transceiver receptacle 10, for example, the transceiver receptacle 10 shown in FIG. 1, in accordance with a preferred embodiment of the present invention. As shown in FIG. 2, the transceiver receptacle 10 includes a cage 14 and a bezel clip 31, and may also include a heatsink 21, a connector 17, and an EMI absorber 18. As shown in FIG. 2, the connector 17 can be, for example, a double density (DD) connector such as a Quad Small Form-factor Pluggable Double-Density (QSFP-DD) connector. The connector 17 provides an electrical or optical connection with a transceiver 20 when the transceiver 20 is inserted into the transceiver receptacle 10.

Figure 3A:
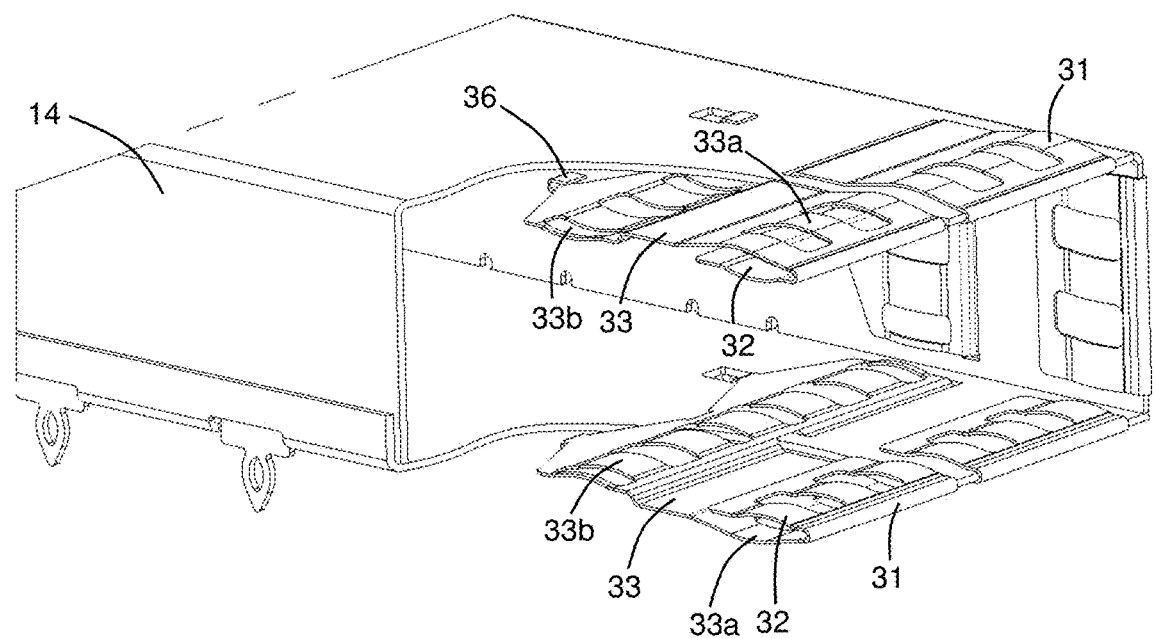
Figure 3B:
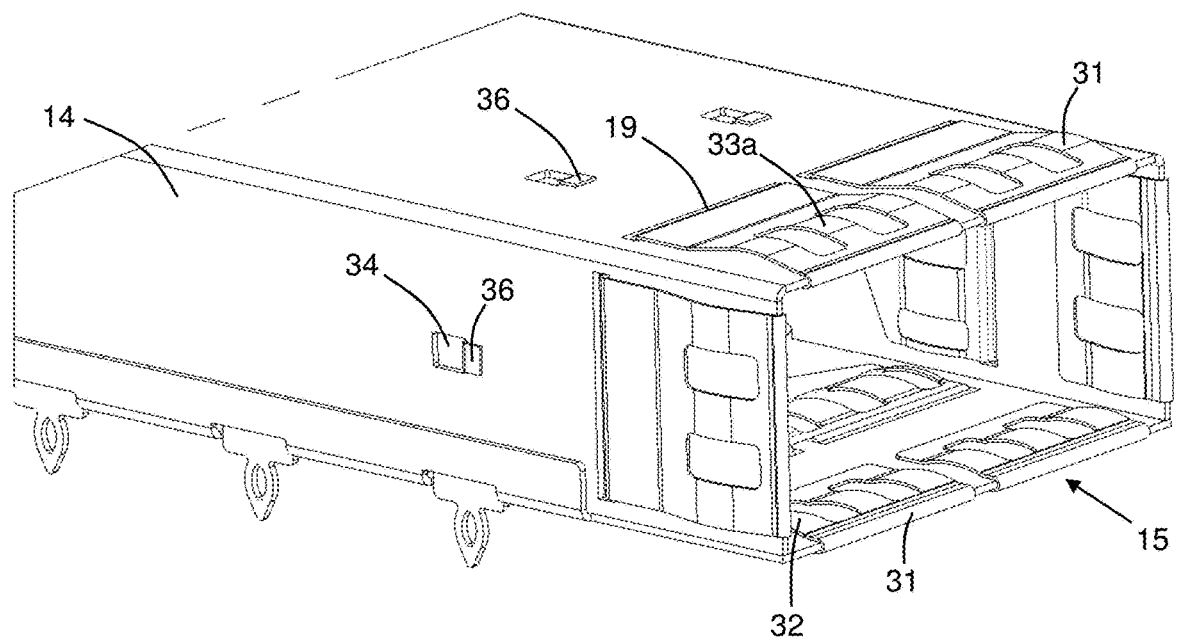

FIGS. 3A and 3B are enlarged perspective views of the bezel clips 31 of the transceiver receptacle 10 shown in FIG. 2. The bezel clips 31 can include tabs 36 on inner fingers 33b that engage with corresponding tab apertures 34 in the cage 14 to secure the bezel clips 31 to the cage 14. In some applications, the tabs 36 might not be necessary. Inner fingers 33b, and the other fingers described herein, can each be physically separated from one another over a portion of their respective lengths by interleaved air gaps, can be cantilevered at only one end, and can be physically or electrically connected together at opposed ends. Fingers include, but are not limited to, fingers with only one respective free end. FIG. 3C is a cross-sectional view of the bezel clips 31 with the tabs 36 and the tab apertures 34 in the cage 14. FIG. 4 is a perspective view of the bezel clips 31. Although the tab 36 and tab apertures 34 are shown as one possible approach to secure the bezel clips 31 to the cage 14, the bezel clips 31 can be secured by soldering, interference-fit connections, and the like. Inner fingers 33b can be spaced away from a bezel opening 15 of the cage 14 and spaced away from first fingers 32 such that the inner fingers 33b only physically touch an electrically conductive outer surface of an electrical connector or transceiver 20 and not a panel wall of device 100.

As shown in FIGS. 3A to 3C and 4, each of the bezel clips 31 includes first fingers 32 and second fingers 33. The first fingers 32 are located along an inner surface of the cage 14, and can, for example, pass through or touch through holes 19 provided in the cage 14. The second fingers 33 are significantly longer than the first fingers 32. In addition, the second fingers 33 pass through a through hole 19 in the cage 14, and thus include outer fingers 33a located along an outer surface of the cage 14 and inner fingers 33b located on the same inner surface of the cage 14 as the first fingers 32. Although the through holes 19 in the cage 14 could potentially provide locations of EMI emissions, EMI shielding for the through holes 19 is provided by the arrangement of the second fingers 33 passing through the through holes 19 to define the inner fingers 33b and outer fingers 33a of the second fingers 33. In addition, the tab apertures 34 in the cage 14 provide no significant EMI emissions, as they are located within a device that includes the transceiver receptacle 10, which significantly reduces or eliminates any EMI being emitted to the device's 100 exterior.

Figure 6:
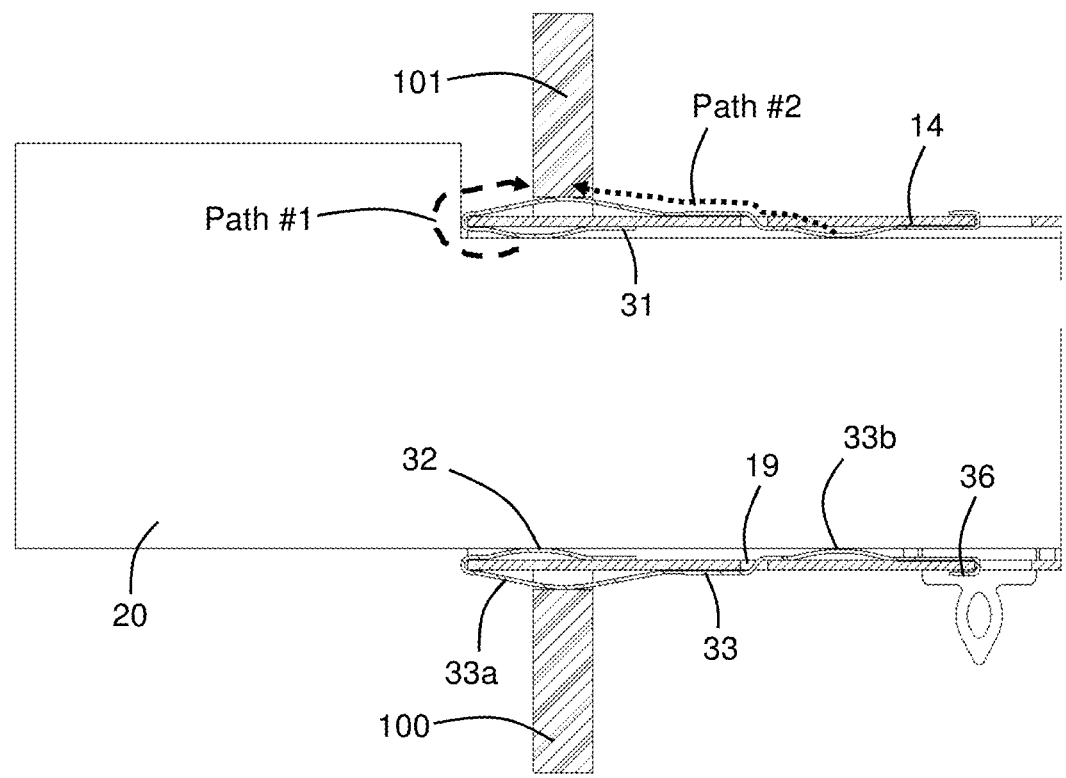
FIG. 6 shows the ground paths for a device with a transceiver receptacle according to preferred embodiments of the present invention.

Preferably, as shown in FIGS. 3C, 4, and 6, each of the first fingers 32, the outer fingers 33a of the second fingers 33, and the inner fingers 33b of the second fingers 33 can include a raised surface (e.g., a "bump") that provides a press-fit mechanical and electrical connection. More specifically, the raised surface of the outer fingers 33a provides a mechanical and electrical connection from the EMI bezel to the chassis ground 101 of the device 100 that includes the transceiver receptacle 10. Both of the first fingers 32 and the inner fingers 33b contact the transceiver 20 when the transceiver 20 is inserted into the cage 14 of the transceiver receptacle 10. Accordingly, the overall number of bezel finger contact points with the transceiver 20 is able to be increased, for example, by about double when compared with other receptacles, including, for example, the known receptacle shown in FIG. 11, due to the additional contact points provided by the inner fingers 33b. This increase in the overall number of bezel finger contact points with the transceiver 20 also reduces the series impedance of the ground connection of the cage 14 by about 50% or more when compared with other receptacles. A method to reduce unwanted EMI emissions can include reducing the series impedance of a ground connection between a cage 14, a bezel clip 31, and a mating connector or transceiver by adding points of physical and electrical contact between the bezel clip 31 and the mating connector or transceiver, such as an electrically conductive outer surface of a mating connector or transceiver. Another method can include decreasing EMI emission from a cage 14 by adding points of physical and electrical contact between a bezel clip 31 of the cage 14 and a mating connector or transceiver, such as an electrically conductive outer surface of a mating connector or transceiver.

Figure 11:
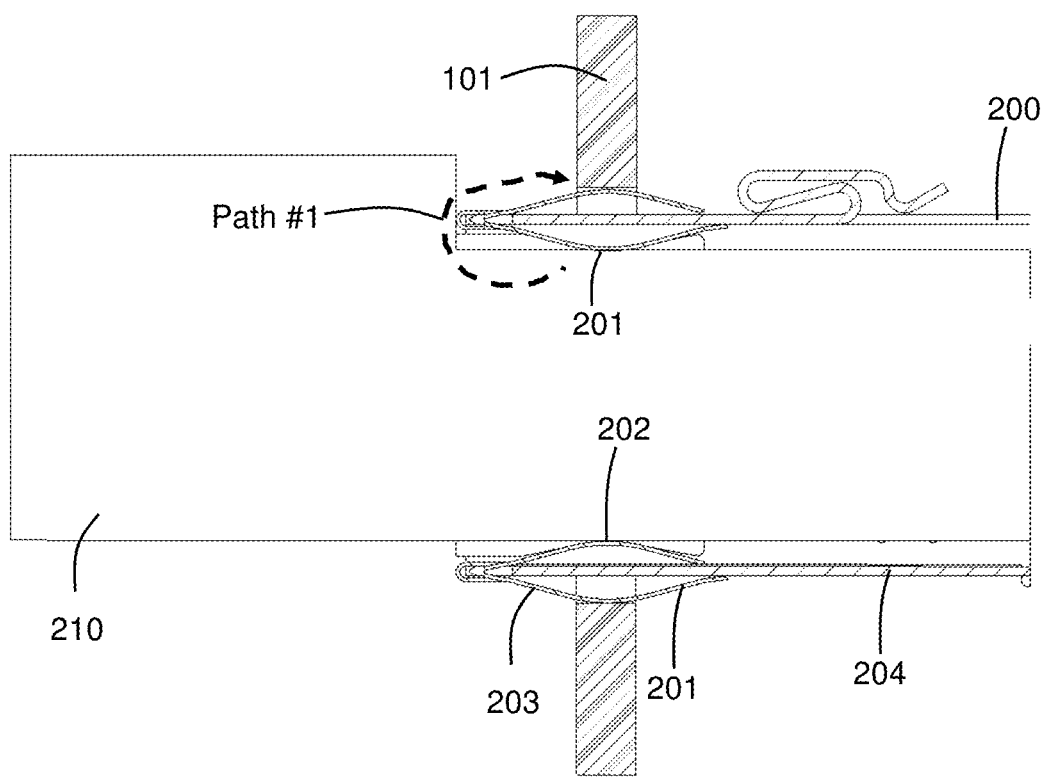
FIG. 11 shows the ground paths for a device with a known transceiver receptacle.
Figure 12A:
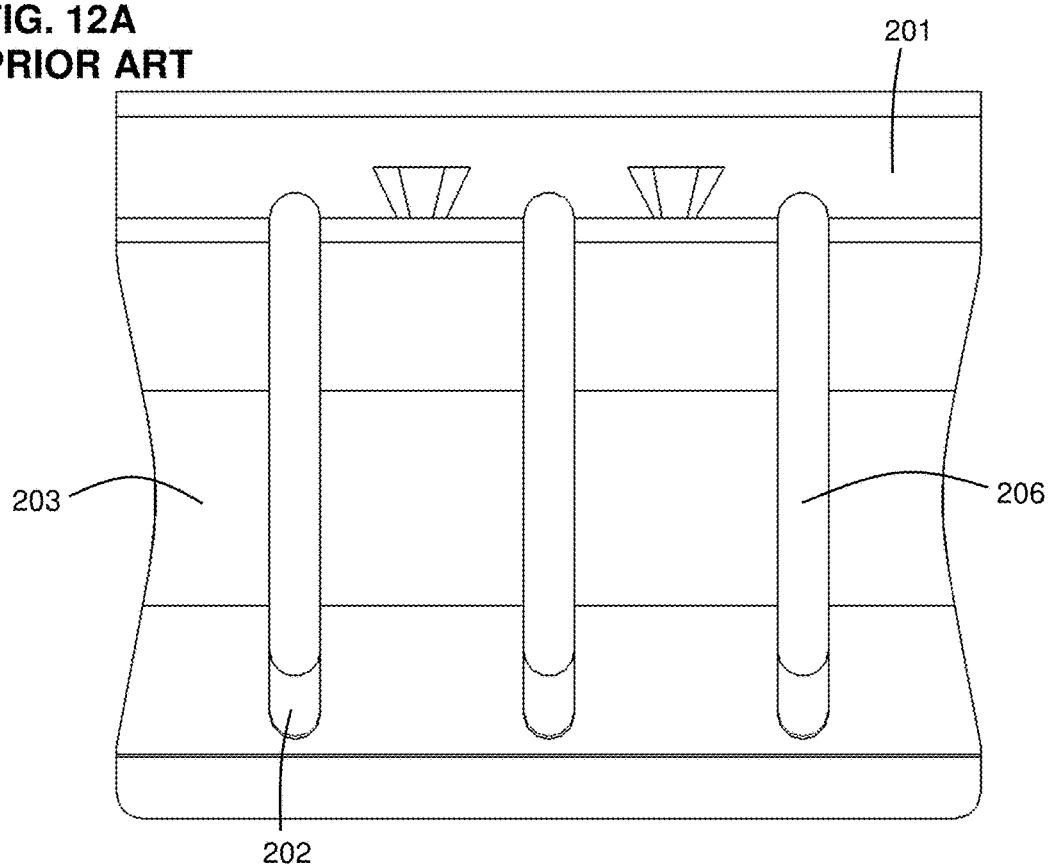
FIGS. 12A and 12B show the bezel clip of a known transceiver receptacle.
Figure 12B:
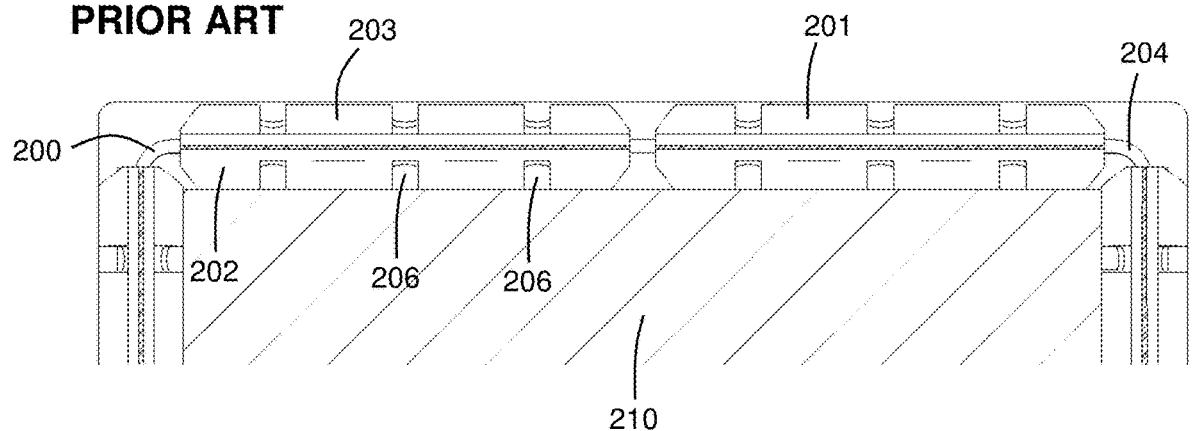

In addition, the inner fingers 33b are located in an interior of the device 100 that includes the transceiver receptacle 10, that is, behind the bezel opening 15 of the transceiver receptacle 10 in a direction toward a rear wall of the cage 14. Thus, as shown in FIG. 6, EMI generated within the transceiver 20 is able to be routed by a short electrical path from the second fingers 33, through the through hole 19 of the cage 14, and to a ground connection between the raised surface of the outer fingers 33a and the chassis ground 101 of the device 100. Further, since the grounding path begins within the device 100 at the inner fingers 33b, and not outside of the device 100 within the bezel opening 15 as shown in FIG. 11, a transceiver receptacle 10 according to the preferred embodiments of the present invention is able to significantly reduce EMI emissions both when the transceiver receptacle 10 is empty and when the transceiver receptacle 10 is mated with a transceiver 20. Stated another way, a method includes shorting unwanted EMI fields generated by a transceiver or other mating electrical connector to ground before the EMI fields reach an opening in a panel that receives outer fingers 33a or first fingers 32 of a bezel clip 31. Moreover, when the transceiver receptacle 10 is mated with a transceiver 20, the increased number of contact points between the first and second fingers 32, 33 and the transceiver 20 significantly improves heat dissipation away from the connector 17, which also helps to reduce EMI emissions. A method can include dissipating heat away from a connector 17 by increasing the number of contact points between the first and second fingers 32, 33 of a bezel clip 31 and a heat source, such as a transceiver 20 or other mating connector.

Figure 5A:
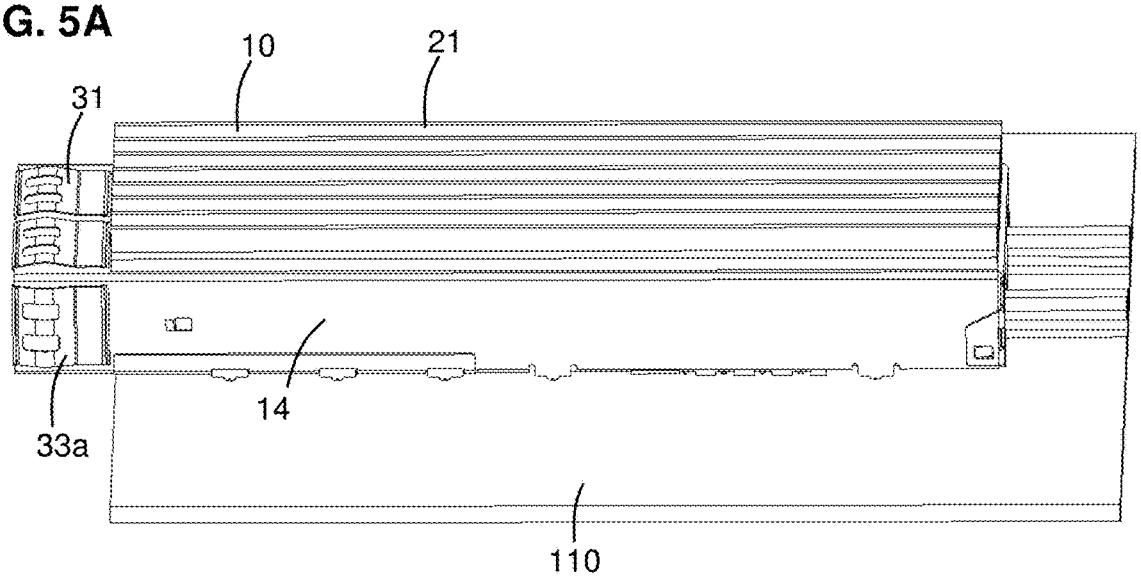
FIGS. 5A and 5B are a top perspective view and a bottom view of the transceiver receptacle shown in FIG. 2 mounted on a host PCB or host substrate.
Figure 5B:
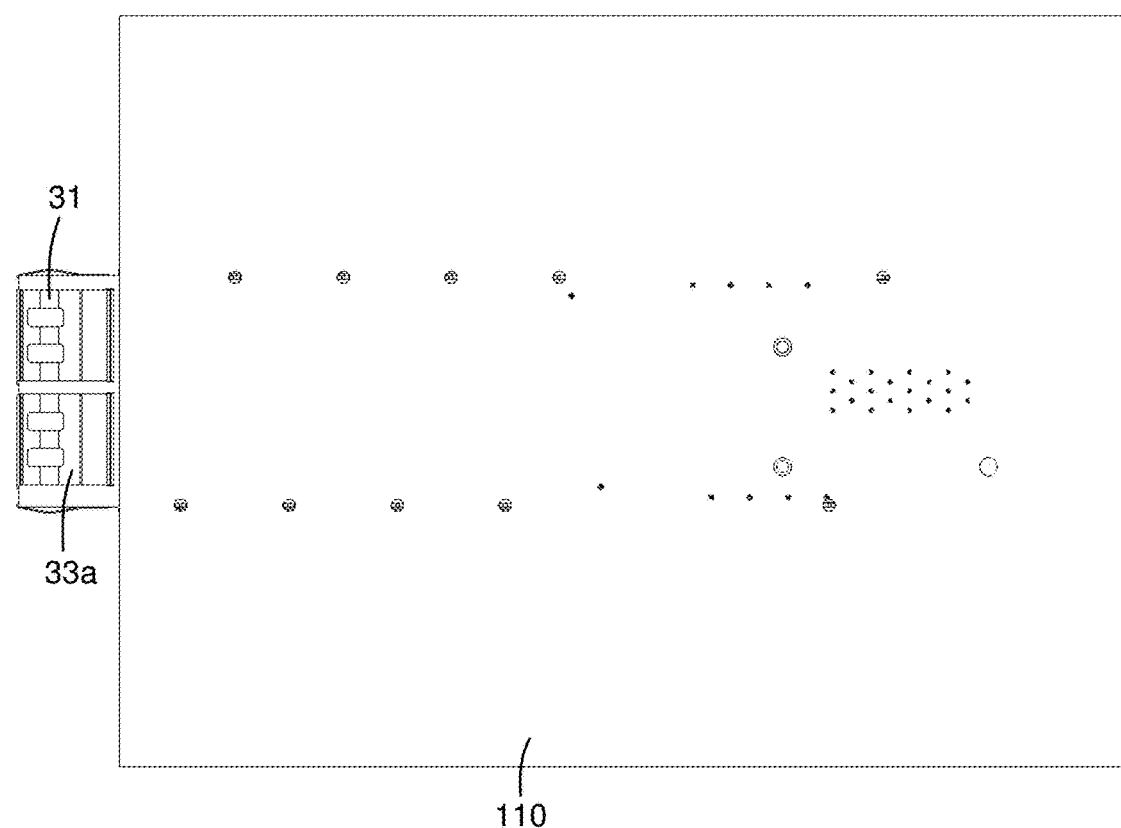

FIGS. 5A and 5B are top and bottom perspective views of the transceiver receptacle 10 shown in FIG. 2 mounted on a host substrate 110. The host substrate 110 can be any suitable substrate, including a PCB.

The transceiver receptacle 10 shown in FIG. 2 provides significantly improved shielding performance, when compared to the prior art, in the frequency range of about 8 GHz to about 14 GHz and provides better shielding effectiveness, when compared with the noise floor, in the frequency range of about 4 GHz to about 14 GHz.

Although the transceiver receptacle 10 shown in FIG. 2 provides performance in the frequency band of about 500 MHz to about 4 GHz and in the frequency band of about 14 GHz to about 20 GHz that are very close to the noise floor, shielding performance in these frequency bands can be easily increased, for example, by including preamplifiers. Overall, the transceiver receptacle 10 shown in FIG. 2 is able to increase dynamic range by about 10 dB, which can then be further increased to about 35 dB to about 45 dB when preamplifiers and automated acquisition are implemented.

The transceiver receptacle 10 of the preferred embodiments of the present invention, and more specifically the cage 14 and bezel clip 31, can provide consistent shielding effectiveness even after the heatsink is removed and replaced four times. Accordingly, the transceiver receptacles according to the preferred embodiments of the present invention are durable and reliable, in addition to providing higher shielding effectiveness.

Figure 7A:
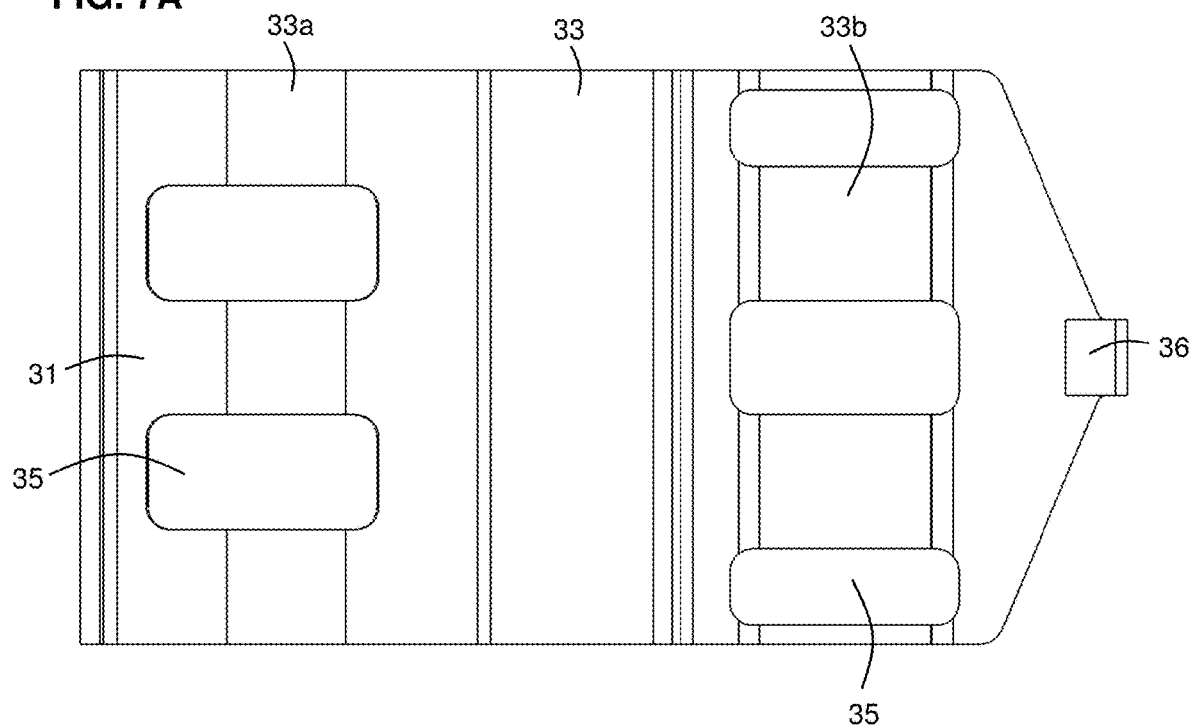
FIGS. 7A and 7B show a bezel clip according to preferred embodiments of the present invention.
Figure 7B:
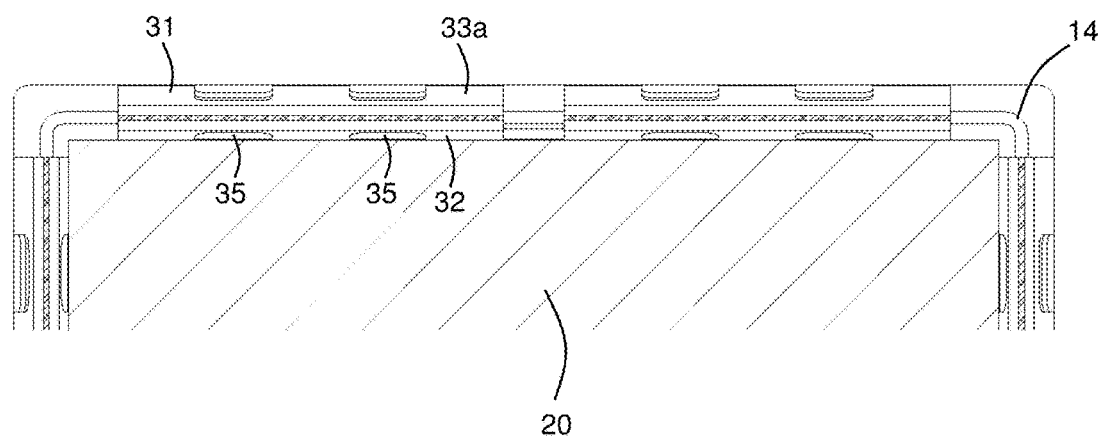

FIGS. 7A and 7B show apertures 35 in a bezel clip 31 according to preferred embodiments of the present invention. As shown in FIG. 7A, the apertures 35 formed by the spaces or air gaps between the fingers of the first fingers 32 do not overlap with the apertures 35 formed by the spaces or air gaps between the inner fingers 33b of the second fingers 33. That is, the apertures 35 defined by the spaces between the first fingers 32 overlap with the conductive portions of the inner fingers 33b of the second fingers 33 in an insertion direction of the transceiver 20, and the apertures 35 defined by the spaces between the inner fingers 33b of the second fingers 23 overlap with the conductive portions of the first fingers 32 in the insertion direction of the transceiver 20. Accordingly, the first fingers 32 and the inner fingers 33b do not provide any visible, line-of-sight apertures, as shown in FIG. 7B, thereby significantly reducing EMI emissions through the bezel opening 15 of the transceiver receptacle 10. A method can include overlapping apertures 35 defined by spaces or air gaps between first fingers 32 with inner fingers 33b of a bezel clip 31 or overlapping apertures 35 defined by spaces or air gaps between inner fingers 33b of second fingers 33 with first fingers 32 to reduce unwanted EMI radiation.

Figure 8A:
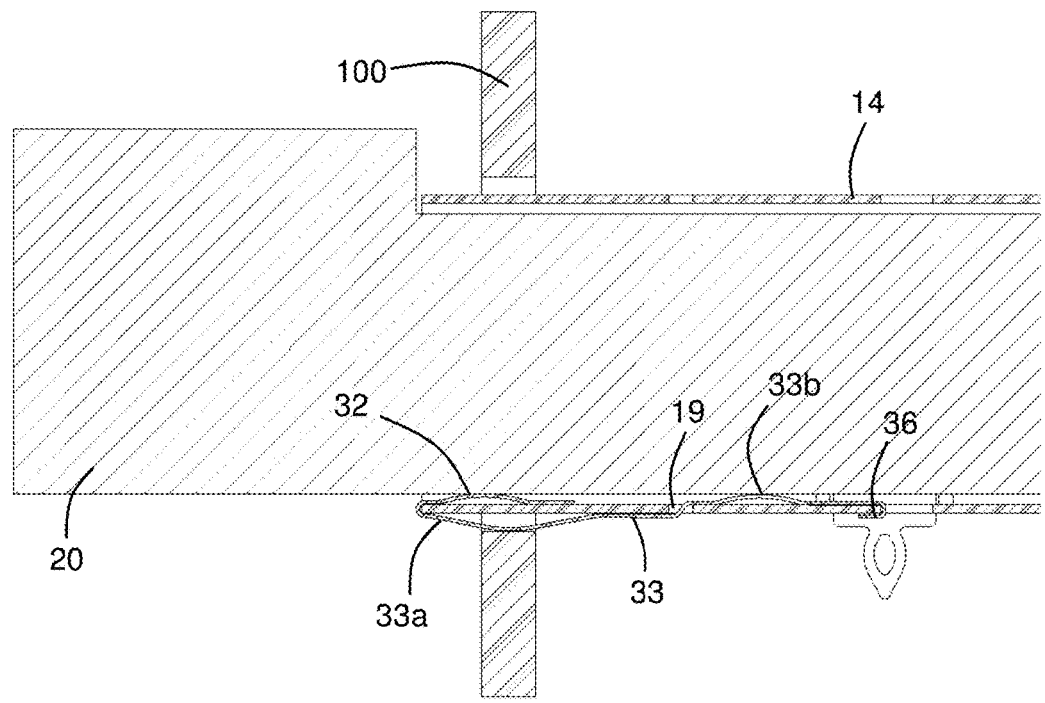
FIGS. 8A and 8B show the bottom of a cage of a transceiver receptacle according to preferred embodiments of the present invention.
Figure 8B:
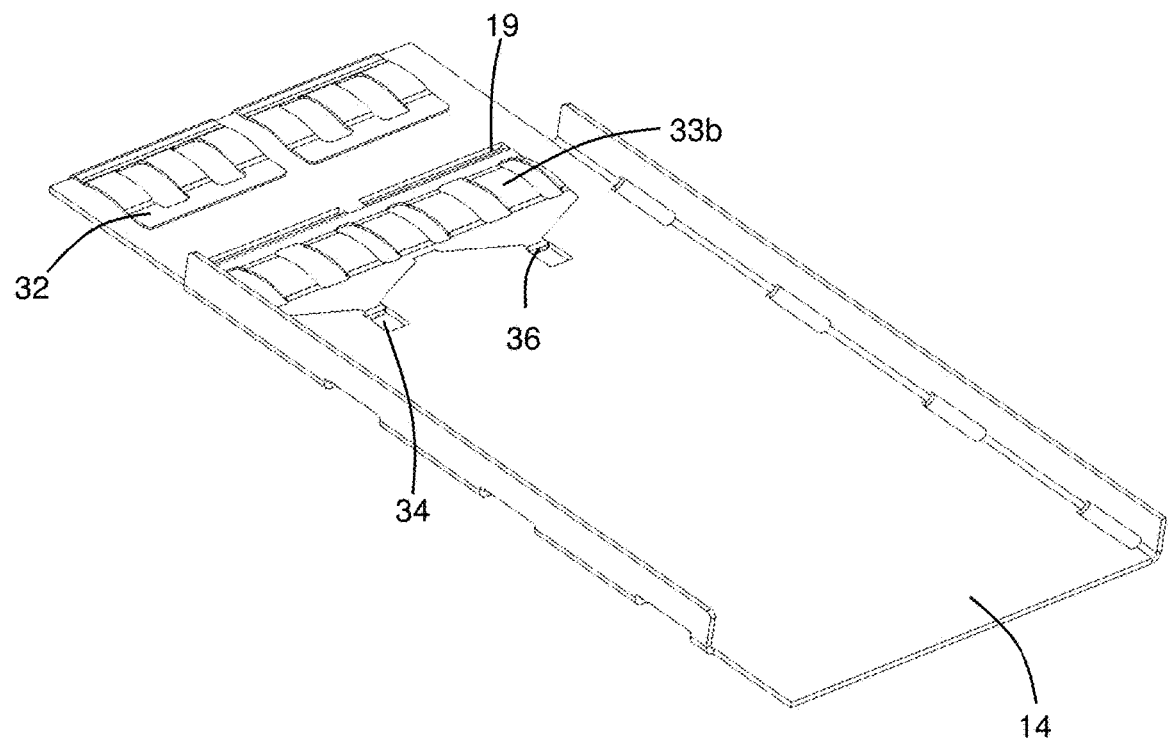

FIGS. 8A and 8B show the bottom of the cage 14 of a transceiver receptacle 10 according to preferred embodiments of the present invention. As shown in FIGS. 8A and 8B, the transceiver 20 is able to be securely fit and be held by the bezel clip 31, due to the increased number of contact points provided by the first fingers 32 and the inner fingers 33b. Accordingly, because spring apertures are not included in the bottom of the cage 14, the cage 14 according to preferred embodiments of the present invention is able to significantly reduce the amount of EMI that passes through the bottom of the cage 14. In addition, by not including springs in the cage 14, problems such as a portion of a transceiver 20 snagging on a portion of the transceiver receptacle 10 (e.g., "snubbing") are able to be significantly reduced or eliminated. Also, the bezel clips 31 can be welded or adhered to the EMI/transceiver cage such that no extraneous holes are formed in the EMI cage except those to necessary to receive plug connectors, mating receptacle connectors, EMI bezel fingers, or heat sinks. Methods include eliminating springs and their related apertures in a bottom wall of a cage 14 or providing a cage 14 that is devoid of bottom springs and their related apertures such that EMI radiation emission from the bottom wall of the cage 14 is prevented or significantly reduced.

Figure 9:
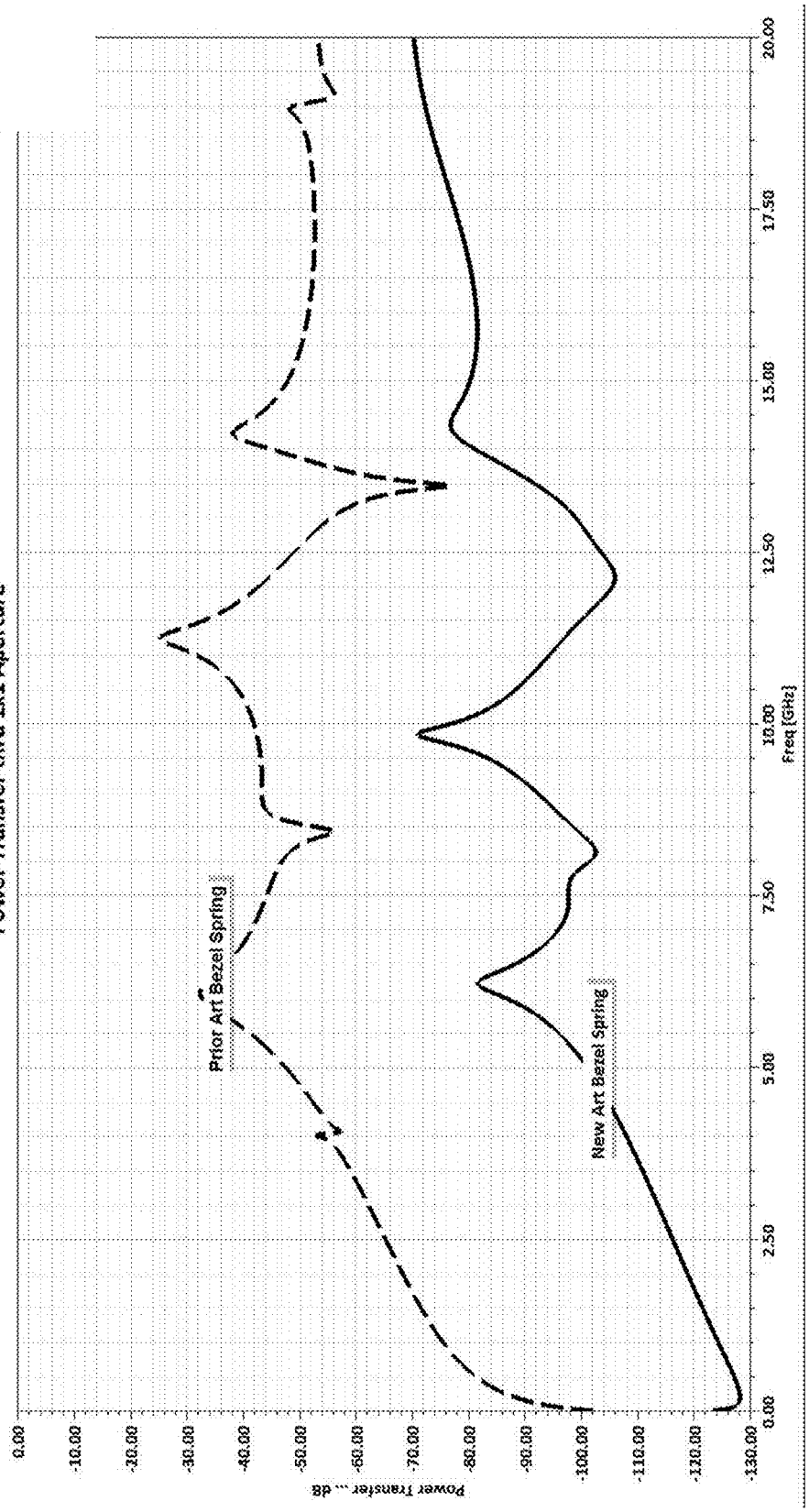
FIG. 9 is a graph showing a comparison between the power transferred through a transceiver receptacle according to a preferred embodiment of the present invention and a known transceiver receptacle.
Figure 10:
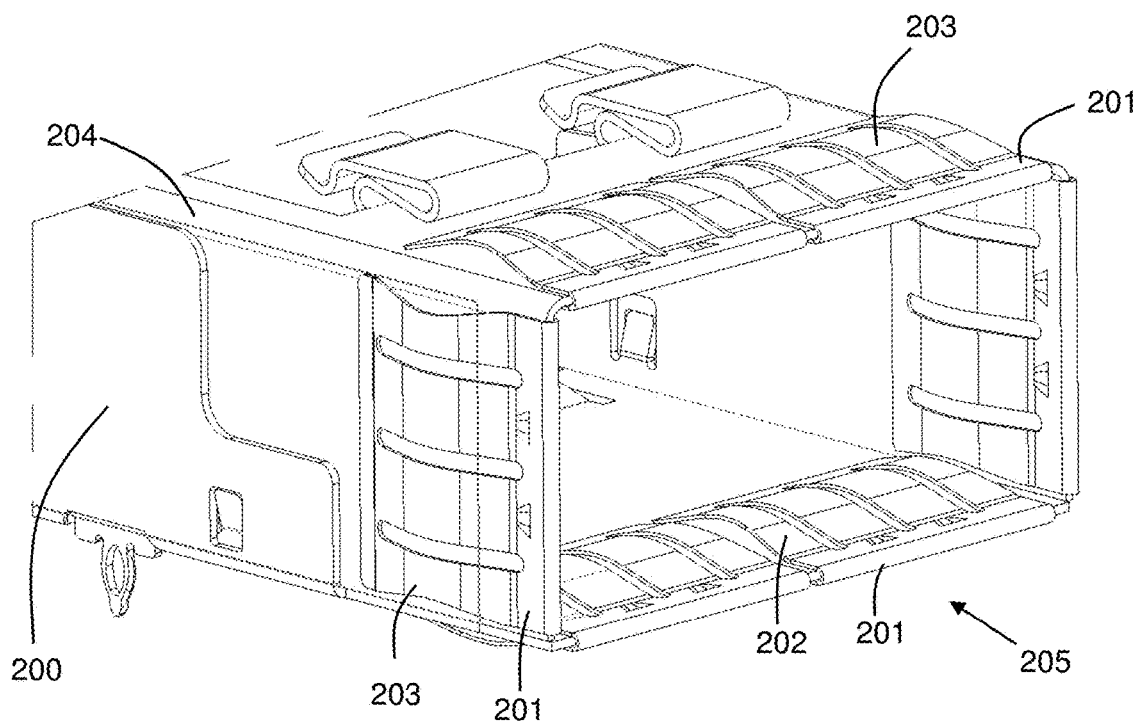
FIG. 10 is partial perspective view of a known transceiver receptacle.
Figure 13A:
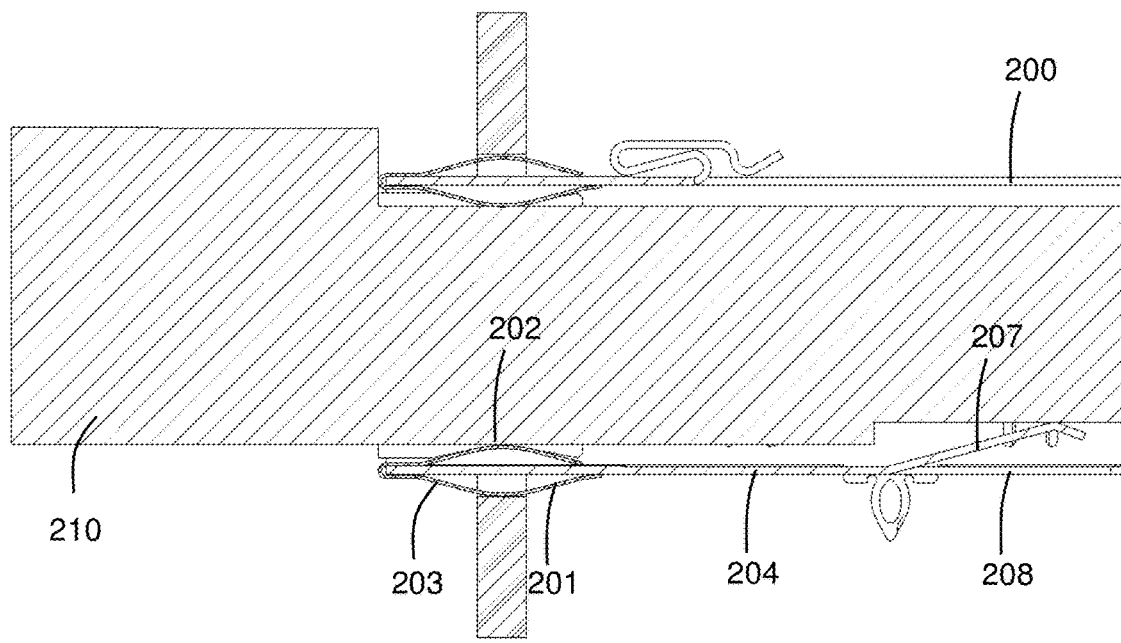
FIGS. 13A and 13B show spring apertures in the bottom of a cage of a known transceiver receptacle.
Figure 13B:
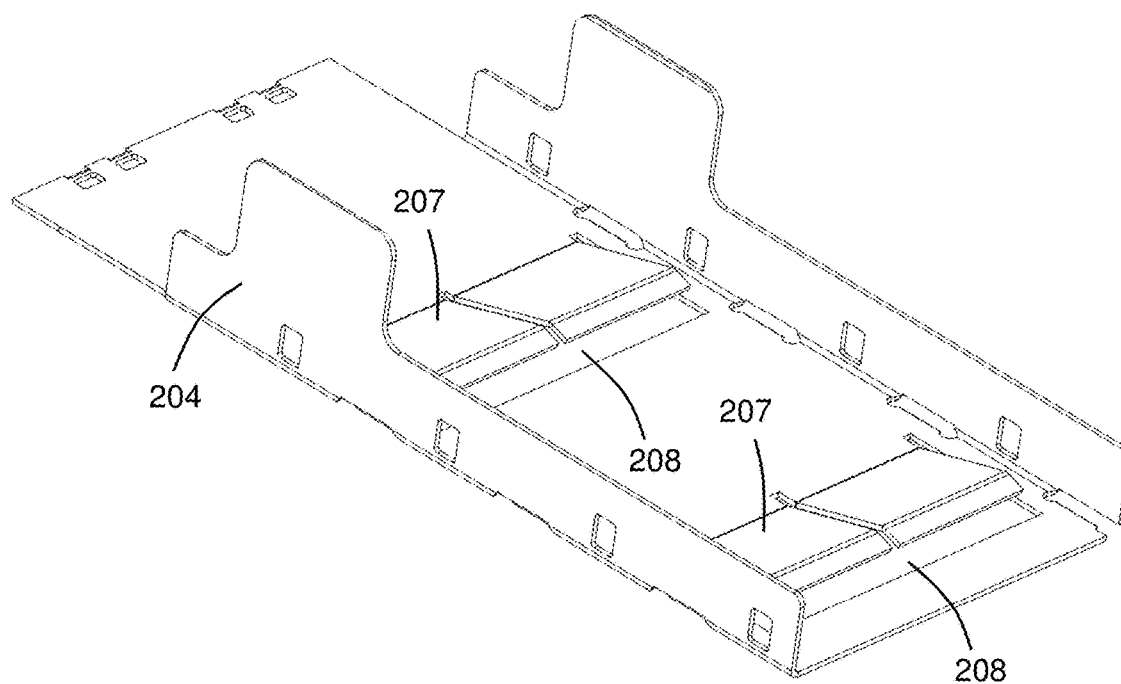

FIG. 9 is a graph showing a comparison between the power transferred through the transceiver receptacle 10 shown in FIGS. 8A and 8B ("New Art Bezel Spring") and the known transceiver receptacle 20 shown in FIGS. 13A and 13B ("Prior Art Bezel Spring"). As shown in FIG. 9, the cage 14 of the transceiver receptacle 10 shown in FIGS. 8A and 8B provides roughly a 50% reduction in power transferred through the bezel opening 15 when compared with the cage 204 of the known transceiver receptacle 200 shown in FIGS. 13A and 13B. For example, at around 12 GHz, the power transfer is less than −90 dB. Thus, by not including springs 207 and their corresponding spring apertures 208 in the cage 204, the overall shielding effectiveness of a transceiver receptacle 10 according to the preferred embodiments of the present invention is able to be significantly improved.

Although the second fingers preferably include outer fingers and inner fingers that extend into the cage, the preferred embodiments of the present invention are not limited thereto. For example, the inner fingers can be modified to contact the first fingers at or in a vicinity of the through hole, to terminate at or in a vicinity of the through hole and not extend into the cage, and the like.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A receptacle comprising:
a cage;
a bezel opening in the cage; and
at least one bezel clip mounted adjacent to the bezel opening; wherein
the at least one bezel clip includes first bezel fingers and second bezel fingers;
the first bezel fingers are located along an inner surface of the cage;
the second bezel fingers include outer fingers located along an outer surface of the cage and inner fingers located along the inner surface of the cage; and
the inner and outer fingers of the second bezel fingers are defined by the second bezel fingers passing through a through hole in the cage.

2. The receptacle according to claim 1, wherein:
the inner fingers of the second bezel fingers extend farther into an interior of the cage than the first bezel fingers extend along an exterior of the cage.

3. The receptacle according to claim 1, wherein, when the receptacle is mounted in an electronic device with a shielded enclosure and when a transceiver is inserted into the receptacle, the inner fingers of the second bezel fingers provide a ground path between the transceiver and the shielded enclosure that is located completely within the electronic device.

4. The receptacle according to claim 1, wherein:
in an insertion direction of a transceiver, apertures in the first bezel fingers do not overlap with apertures in the inner fingers of the second bezel fingers.

5. The receptacle according to claim 1, wherein:
no springs and no spring apertures are included on a bottom of the cage.

6. The receptacle according to claim 1, wherein when a transceiver is inserted into the receptacle, each of the first bezel fingers and the inner fingers of the second bezel fingers contact the transceiver.

7. An electronic device comprising:
a shielded enclosure;
the receptacle according to claim 1 mounted in the electronic device; and
a transceiver inserted into the receptacle; wherein the inner fingers of the second bezel fingers provide a ground path between the transceiver and the shielded enclosure that is located completely within the electronic device.

8. A receptacle comprising:

a cage; and a bezel clip physically attached to the cage and including first inner fingers and second inner fingers; wherein only the first inner fingers and the second inner fingers of the bezel clip physically touch an electrically conductive outer surface of a mating connector of the receptacle, the second inner fingers are spaced away from the first inner fingers, and the second inner fingers are spaced farther away from a bezel opening of the cage than the first inner fingers.

9. The receptacle according to claim 8, wherein the cage includes a bottom wall that is devoid of springs and of apertures associated with springs.

10. A bezel clip for a connector cage comprising:

outer fingers that physically contact a panel of a device that includes the connector cage;

first inner fingers that physically touch a first outer surface of a mating connector of the connector cage; and second inner fingers spaced from the outer fingers and the first inner fingers in a mating direction of the mating connector of the connector cage and physically touching a second outer surface of the mating connector.

11. The bezel clip according to claim 10, wherein the first outer surface and the second outer surface are different outer surfaces of the mating connector.

12. The bezel clip according to claim 10, wherein the first outer surface and the second outer surface are a same outer surface of the mating connector.

13. The bezel clip according to claim 10, wherein the connector cage includes a bottom wall that is devoid of springs and of apertures associated with springs.

* * * * *